United States Patent [19]

Miki

[11] Patent Number: 4,942,138
[45] Date of Patent: Jul. 17, 1990

[54] ION-IMPLANTATION OF WIRING ELECTRODES OF A SEMICONDUCTOR DEVICE FOR HILLOCK REDUCTION

[75] Inventor: Kazumi Miki, Nara, Japan

[73] Assignee: Sharp Kabushiki Kaisha, Osaka, Japan

[21] Appl. No.: 290,039

[22] Filed: Dec. 23, 1988

[30] Foreign Application Priority Data

Dec. 26, 1987 [JP] Japan .................................. 62-332246

[51] Int. Cl.⁵ .................... H01L 21/265; H01L 21/28
[52] U.S. Cl. ...................................... 437/182; 437/24; 437/35; 437/957
[58] Field of Search .................. 437/24, 35, 182, 957; 204/192.34; 156/634, 640, 665, 643

[56] References Cited

U.S. PATENT DOCUMENTS 4,410,622 10/1983 Dalal et al. ........................... 430/312
4,704,367 11/1987 Alvis et al. ............................. 437/24

FOREIGN PATENT DOCUMENTS 57-42149   3/1982 Japan .
57-130450  8/1982 Japan .
57-130451  8/1982 Japan .
59-4058    1/1984 Japan .................................. 437/957

OTHER PUBLICATIONS

Kamli et al., "Ion Implanted Double Level Metal Process", EDM Tech. Digest (1984), pp. 138-141.

Primary Examiner—Olik Chaudhuri
Attorney, Agent, or Firm—Irell & Manella

[57] ABSTRACT

An ion-implantation method for wiring electrodes of a semiconductor device comprises irradiating the wiring electrodes with ion beams from at least two directions to prevent occurrence of hillocks.

3 Claims, 2 Drawing Sheets

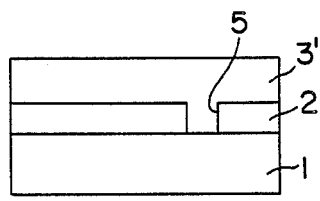
FIG. IA
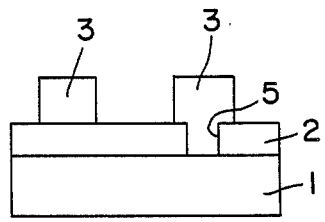
FIG. IB
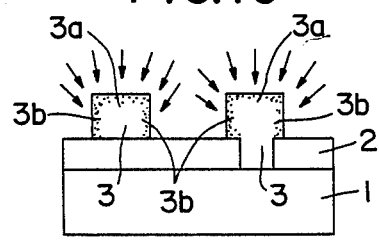
FIG. IC
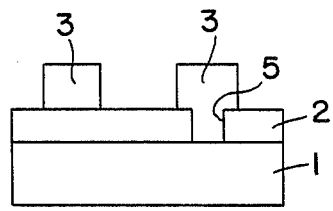
FIG. ID

ION-IMPLANTATION OF WIRING ELECTRODES OF A SEMICONDUCTOR DEVICE FOR HILLOCK REDUCTION

BACKGROUND OF THE INVENTION

1. Field of the Invention

This invention relates to an ion-implantation method which is used in the manufacturing process for semiconductor devices such as integrated circuits, and more particularly, to an ion-implantation method for wiring electrodes of a semiconductor device to prevent occurrence of hillocks on the surface of the wiring electrode.

2. Description of the Prior Art

The wiring electrodes disposed in semiconductor devices such as integrated circuits are usually made of aluminum or an aluminum alloy containing a trace amount of an element such as Si, Cu, and Ti. After the wiring electrodes are formed in a given pattern, constituent atoms of the wiring electrodes are moved in such a direction as to reduce internal stresses during heat treatment, which gives rise to convex portions (hereinafter referred to as "hillocks") and concave portions (hereinafter referred to as "voids") in the surface of the wiring electrodes. Of the two occurrences, the hillocks cause insulation failure and electrical shorts between the neighboring wiring electrodes. They will also be responsible for insulation failure and electrical shorts between the above-mentioned wiring electrodes and the wiring electrodes to be formed later in the upper layer over an insulating film.

For example, as shown in FIG. 2, when a wiring electrode 13 is formed in a given pattern on top of an insulating film 12 which covers the semiconductor substrate 11, there occur hillocks 14a and 14b on the surface of the wiring electrode 13 after heat treatment. Particularly, the hillock projecting from the top surface of the wiring electrode 13 is referred to as the vertical hillock 14a. The hillock projecting from the side surface of the wiring electrode 13 is referred to as the lateral hillock 14b. If vertical hillocks 14a occur in a multi-layered wiring structure, when additional wiring electrodes are formed in the upper layer over another insulating film, the insulating film becomes thin in the area where the vertical hillocks 14a project upward. Thus, there is the danger of insulation failure between the lower and the upper wiring electrodes. Also, if lateral hillocks 14b occur, the space between the neighboring wiring electrodes in the same layer becomes narrow in the area where the lateral hillocks 14b project sideward. Thus, there is the danger of electrical shorts between the neighboring wiring electrode in the same layer. As a pattern of wiring electrodes becomes minute due to high density of integrated circuits, the danger of insulation failure and electrical shorts caused by vertical and lateral hillocks becomes marked, which causes a decrease in the reliability of the final product. For this reason, it has become of particular interest in recent years to provide an ion-implantation method used in the manufacturing process of semiconductor devices, which can prevent occurrence of hillocks on the surface of the wiring electrodes.

Usually, in the manufacturing process for semiconductor devices, after the formation of the wiring electrodes 13 in a given pattern, ion implantation is conducted in the direction normal to the top surface of the wiring electrodes 13 as shown in FIG. 3. By the ion implantation of argon, arsenic, or the like in the upper regions 13a near the top surface of the wiring electrodes 13 which are made of aluminum or an aluminum alloy, it is possible to improve the quality of the upper regions 13a. After the quality of the upper regions 13a of the wiring electrodes 13 is improved in this way, there is no occurrence of vertical hillocks 14a on the top surface thereof.

However, even when such a method is used, because ion implantation is conducted in one direction, from above only, the quality of the side regions 13b near the side surfaces of the wiring electrodes 13 cannot be improved. Hence, as shown in FIG. 4, there is occurrence of lateral hillocks 14b from the side surfaces of the wiring electrodes 13. Thus, there remains as yet the danger of electrical shorts between the neighboring wiring electrodes 13, which introduces a problem that it is not possible to ensure sufficient reliability of final products.

SUMMARY OF THE INVENTION

The ion-implantation method of this invention, which overcomes the above-discussed and numerous other disadvantages and deficiencies of the prior art, comprises irradiation wiring electrodes of a semiconductor device with ion beams from at least two directions.

In a preferred embodiment, the angle of incidence of said ion beams is fixed at a certain angle to the direction normal to the top surface of said wiring electrodes.

In a preferred embodiment, the angle of incidence of said ion beams is changed in a stepwise or continuous fashion.

In a preferred embodiment, the ion beams contain argon ions or arsenic ions.

Thus, the invention described herein makes possible the objectives of (1) providing an ion-implantation method for wiring electrodes, which can prevent occurrence of hillocks over all the surfaces of the wiring electrodes; and (2) providing an ion-implantation method for wiring electrodes by which there is no danger of electrical shorts between the neighboring wiring electrodes, so that finished semiconductor devices such as integrated circuits can be improved in their reliability.

BRIEF DESCRIPTION OF THE DRAWINGS

This invention may be better understood and its numerous objects and advantages will become apparent to those skilled in the art by reference to the accompanying drawings as follows:

FIGS. 1A to 1D are cross-sectional views showing the formation of wiring electrodes in which the ion-implantation method of this invention is used to prevent the occurrence of hillocks on the wiring electrodes.

DESCRIPTION OF THE PREFERRED EMBODIMENTS

Figure 2:
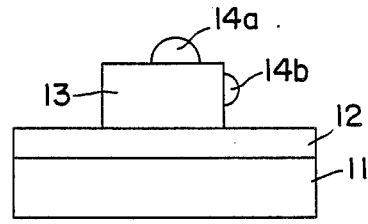
FIG. 2 is a cross-sectional view showing the occurrence of hillocks on the surface of a wiring electrode.
Figure 3:
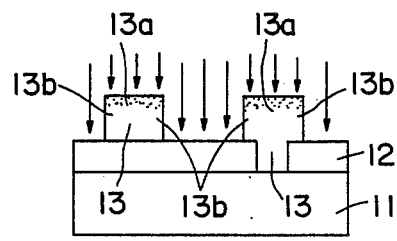
FIG. 3 is a cross-sectional view showing an ion-injection step with the conventional method.
Figure 4:
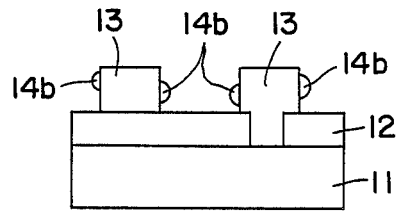
FIG. 4 is a cross-sectional view showing the ocurrence of hillocks on the side surfaces of the wiring electrodes after the ion-injection step of FIG. 3.

In the ion-implantation method for wiring electrodes of this invention, which is used in the manufacturing process of semiconductor devices, after the formation of the wiring electrodes in a given pattern, ion implantation is conducted for these wiring electrodes with changes in the angle of incidence of the ion beams used.

The direction of implantation with respect to the wiring electrodes can be altered by moving the semiconductor device which has the wiring electrodes or by changing the direction of incidence of ion beams from an ion-implantation apparatus. To attain the excellent advantages of this invention, it is necessary that ion implantation be conducted from at least two directions. For example, when the pattern of the wiring electrodes has been formed on a semiconductor substrate in both the longitudinal and the transverse directions, if ion implantation is conducted from the two slanting directions which are mutually symmetrical with respect to the direction normal to the top surface of the wiring electrodes and which also are mutually symmetrical with respect to both the longitudinal and the transverse patterns of the wiring electrodes, ion implantation can take place in the top surfaces of the wiring electrodes as well as in any of the side surfaces. Of course, if ion implantation is conducted from three directions or more, or if the angle of incidence of ion beams is changed in a stepwise or continuous fashion, ion implantation can take place in all surfaces of the wiring electrodes with still more accuracy.

In the manufacturing process for semiconductor devices, after the formation of the wiring electrodes in a given pattern, these wiring electrodes are subjected to ion implantation with changes in the angle of incidence of ion beams. Thus, ion implantation takes place not only in the top surface, but also in the side surfaces of the wiring electrode, so that the quality of all surfaces of the wiring electrode can be improved. Therefore, in later heat treatment, there is no occurrence of hillocks on the surfaces of the wiring electrodes.

One example of the ion-implantation method for wiring electrodes of this invention will hereinafter be explained with reference to FIGS. 1A to 1D.

First, as shown in FIG. 1A, on the top surface of a semiconductor substrate 1, an insulating film 2 is formed which has an opening 5 at a given position. Then, the entire top surface is covered with a metal film 3'. The opening 5 in the insulating film 2 allows the connection of the semiconductor substrate 1 with the metal film 3'. The metal film 3' is made of an AlSi alloy which is prepared by adding a trace amount of silicon to aluminium.

Next, as shown in FIG. 1B, the metal film 3' is processed into a given pattern by a photoetching technique, resulting in wiring electrodes 3.

Then, as shown in FIG. 1C, the wiring electrodes 3 which have been formed are subjected to ion implantation. In the ion implantation, ion beams containing high-energy argon ions, arsenic ions, or the like, are used to irradiate the wiring electrodes 3. The ion beams are generated from an ion-implantation apparatus with a platen by which the angle of incidence of ion beams can be changed. This ion-implantation apparatus with a platen can freely change the tilt angle of the stage on which the semiconductor substrate 1 with the wiring electrodes 3 is placed. Originally, this apparatus has been used for the prevention of a decrease in symmetry of implantation, which is caused by the shadowing effect of an aperture mask because the angle of incidence of the ion beams varies slightly by shifting the position of the substrate. In this example, such an ion-implantation apparatus with a platen which can change the angle of implantation is used, and by the progressive change in the tilt angle of the stage on which the semiconductor substrate 1 with the wiring electrodes 3 is placed, the direction of incidence of the ion beams will be, as shown by the arrows in FIG. 1C, all direction from above. When ion implantation is conducted in this way, not only the top surfaces 3a of the wiring electrodes 3, but also the side surfaces 3b in every direction are struck by the ions, so that the quality of these regions can be improved.

According to the ion-implantation method for wiring electrodes of this invention, as shown in FIG. 1D, after heat treatment, no hillocks occur on any of the surfaces of the wiring electrodes 3. Therefore, it is possible to prevent insufficient insulation for wiring electrodes which are to be formed in the upper layer over another insulating film, and there is no danger of electrical shorts between the neighboring wiring electrodes 3, so that finished semiconductor devices such as integrated circuits can be improved in their reliability.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An ion-implantation method for suppressing the formation of hillocks in wiring electrodes of a semiconductor device comprising irradiating said wiring electrodes with ion beams containing argon ions or arsenic ions from at least two directions which are inclined with respect to the direction normal to the top surface of said wiring electrodes.

2. An ion-implantation method according to claim 1, wherein the angle of incidence of said ion beams is fixed at a certain angle to the direction normal to the top surface of said wiring electrodes.

3. An ion-implantation method according to claim 1, wherein the angle of incidence of said ion beams is changed in a stepwise or continuous fashion.

* * * * *